(12) United States Patent
Chung et al.

(10) Patent No.: US 11,282,987 B2
(45) Date of Patent: Mar. 22, 2022

(54) DISPLAY DEVICE AND MANUFACTURING METHOD THEREOF

(71) Applicant: SAMSUNG ELECTRONICS CO., LTD., Suwon-si (KR)

(72) Inventors: Deukseok Chung, Yongin-si (KR); Tae Gon Kim, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 14 days.

(21) Appl. No.: 16/777,223

(22) Filed: Jan. 30, 2020

(65) Prior Publication Data
US 2020/0251623 A1 Aug. 6, 2020

(30) Foreign Application Priority Data
Jan. 31, 2019 (KR) .................. 10-2019-0012730

(51) Int. Cl.
| | | |
|---|---|---|
| H01L 33/50 | (2010.01) | |
| H01L 25/075 | (2006.01) | |
| H01L 33/38 | (2010.01) | |
| H01L 27/15 | (2006.01) | |
| H01L 33/00 | (2010.01) | |

(52) U.S. Cl.
CPC ........ H01L 33/502 (2013.01); H01L 25/0753 (2013.01); H01L 27/156 (2013.01); H01L 33/0095 (2013.01); H01L 33/38 (2013.01); H01L 33/504 (2013.01); H01L 2933/0041 (2013.01); H01L 2933/0091 (2013.01)

(58) Field of Classification Search
CPC ............... H01L 25/0753; H01L 27/156; H01L 33/50–504; H01L 2933/0041
See application file for complete search history.

(56) References Cited

U.S. PATENT DOCUMENTS

| | | |
|---|---|---|
| 8,242,679 B2 | 8/2012 | Noh |
| 8,729,551 B2 | 5/2014 | Roh et al. |
| 9,632,306 B2 | 4/2017 | Lee et al. |
| 10,186,549 B1 * | 1/2019 | Cheung .................. H01L 24/81 |
| 10,211,384 B2 | 2/2019 | Jung et al. |

(Continued)

FOREIGN PATENT DOCUMENTS

| | | |
|---|---|---|
| JP | 11160682 | 6/1999 |
| JP | 2008145577 | 6/2008 |
| KR | 1020110104863 | 9/2011 |

(Continued)

OTHER PUBLICATIONS

Hosub Lim, et al., "Continuous Purification of Colloidal Quantum Dots in Large-Scale Using Porous Electrodes in Flow Channel", Scientific Reports, (Feb. 27, 2017), pp. 1-8.

Primary Examiner — Zandra V Smith
Assistant Examiner — Molly K Reida
(74) Attorney, Agent, or Firm — Cantor Colburn LLP (57) ABSTRACT

A method of manufacturing a display device includes preparing a plurality of light-emitting element packages on a substrate, preparing a first solution including first semiconductor nanocrystals, applying a voltage to a part of the plurality of light-emitting element packages to transport the first semiconductor nanocrystals to a region overlapped with the part of the plurality of light-emitting element packages, and forming a first color conversion layer with the first semiconductor nanocrystals.

9 Claims, 9 Drawing Sheets

(56) References Cited

U.S. PATENT DOCUMENTS

2015/0362165 A1* 12/2015 Chu ............... H01L 27/156
                                                        362/235
2017/0250323 A1* 8/2017 Otto ............... H01L 25/0753

FOREIGN PATENT DOCUMENTS

| KR | 1020170112868 | 10/2017 |
| KR | 101847916 | 5/2018 |

* cited by examiner

DISPLAY DEVICE AND MANUFACTURING METHOD THEREOF

CROSS-REFERENCE TO RELATED APPLICATION

This application claims priority to Korean Patent Application No. 10-2019-0012730, filed on Jan. 31, 2019, and all the benefits accruing therefrom under 35 U.S.C. § 119, the content of which in its entirety is herein incorporated by reference.

BACKGROUND

1. Field

Embodiments of a display device and a method of manufacturing the display device are disclosed.

2. Description of the Related Art

Currently, display devices such as a liquid crystal display ("LCD"), a plasma display device, an organic light emitting diode ("OLED") display, and the like are commercially available. The display devices may be driven by providing pixels emitting each of red light, green light, blue light and/or white light and by individually emitting light, or passing light emitted by a light source through a color filter to express colors corresponded to the pixels.

SUMMARY

Among display devices, in a case that a display device has the individual emitting system, although the display device tends to have a high color purity enough to provide excellent image quality, but the display device has a huge processing difficulty since each pixel is formed with a member having different materials and characteristics from each other, so that it is difficult to be formed in a large scale.

In a case that a display device passes light from a light source through a color filter, although it tends to be easily produced in a larger area than the former case, light is absorbed by the color filter, so the energy loss of the emitted light is unavoidable, and deterioration of a luminance and a color purity is a concern since the final emitted light has a somewhat wide full width at half maximum ("FWHM").

An embodiment provides a display device having high color purity and color reproducibility as well as high luminous efficiency. In addition, provided is a manufacturing method of a display device capable of reducing a time and a cost for manufacturing process by forming a color conversion layer and a transmitting layer through simplified processes.

In addition, a technical object to be solved by the disclosure is not limited to the technical object mentioned above, and other technical objects not mentioned may be clearly understood by those skilled in the art to which the invention belongs from the following description.

An embodiment of a display device includes a plurality of light-emitting element packages including a semiconductor light-emitting chip, a protective layer disposed on the plurality of light-emitting element packages, and a first color conversion layer, a second color conversion layer, and a transmitting layer disposed on the protective layer, where each of the first color conversion layer, the second color conversion layer, and the transmitting layer is overlapped with one of the plurality of light-emitting element packages, the first color conversion layer includes a plurality of first semiconductor nanocrystals and the plurality of first semiconductor nanocrystals forms at least two layers.

In an embodiment, a part of the plurality of first semiconductor nanocrystals may provide a first layer, a remaining part of the plurality of first semiconductor nanocrystals may provide a second layer, and the first layer and the second layer may contact each other.

In an embodiment, first semiconductor nanocrystals of the plurality of first semiconductor nanocrystals included in the first layer and first semiconductor nanocrystals of the plurality of first semiconductor nanocrystals included in the second layer may contact each other.

In an embodiment, the second color conversion layer may include a plurality of second semiconductor nanocrystals and the plurality of second semiconductor nanocrystals may form at least two layers.

In an embodiment, a part of the plurality of second semiconductor nanocrystals may provide a first layer, a remaining part of the plurality of second semiconductor nanocrystals may provide a second layer, and the first layer and the second layer may contact each other.

In an embodiment, a second semiconductor nanocrystal of the plurality of second semiconductor nanocrystals included in the first layer and a second semiconductor nanocrystal of the plurality of second semiconductor nanocrystals included in the second layer may contact each other.

In an embodiment, the plurality of light-emitting element packages overlapped with the first color conversion layer may be electrically connected to each other.

In an embodiment, the plurality of light-emitting element packages overlapped with the second color conversion layer may be electrically connected to each other.

In an embodiment, the plurality of light-emitting element packages overlapped with the transmitting layer may be electrically connected to each other.

In an embodiment, the plurality of light-emitting element packages may include a first conductivity-type semiconductor layer, a second conductivity-type semiconductor layer overlapped with the first conductivity-type semiconductor layer, and an active layer disposed between the first conductivity-type semiconductor layer and the second conductivity-type semiconductor layer.

In an embodiment, the display device may further include a first electrode connected to the first conductivity-type semiconductor layer, and a second electrode connected to the second conductivity-type semiconductor layer and at least one of the first electrode and the second electrode may include nanopores.

In an embodiment, a method of manufacturing a display device includes preparing a plurality of light-emitting element packages on a substrate, preparing a first solution including first semiconductor nanocrystals, applying a voltage to a part of the plurality of light-emitting element packages to transport the first semiconductor nanocrystals to a region overlapped with the part of the plurality of light-emitting element packages, and forming a first color conversion layer with the first semiconductor nanocrystals.

In an embodiment, the method may include preparing a second solution including second semiconductor nanocrystals, applying a voltage to a remaining part of the plurality of light-emitting element packages to transport the second semiconductor nanocrystals to the remaining part of the plurality of light-emitting element packages, and forming a second color conversion layer with the second semiconductor nanocrystals.

In an embodiment, a plurality of light-emitting element packages disposed along one direction may be electrically connected to each other.

In an embodiment, the plurality of light-emitting element packages overlapped with the first color conversion layer may be electrically connected to each other and the plurality of light-emitting element packages overlapped with the second color conversion layer may be electrically connected to each other.

In an embodiment, a central wavelength of light emitted from the plurality of light-emitting element packages may be about 430 nanometers (nm) to about 470 nm.

In embodiments of the invention, since a color conversion layer is formed by an electrophoresis method, a color conversion layer may be formed without a separate exposure apparatus. In other words, the cost and time desired for the manufacturing process of the display device may be reduced. Also, patterning of the color conversion layer may be facilitated by a simplified process.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Hereinafter, referring to the drawings, embodiments are described in detail. In the following description of the disclosure, the well-known functions or constructions will not be described in order to clarify the disclosure.

In order to clearly illustrate the disclosure, the description and relationships are omitted, and throughout the disclosure, the same or similar configuration elements are designated by the same reference numerals. Also, since the size and thickness of each configuration shown in the drawing are arbitrarily shown for better understanding and ease of description, the disclosure is not necessarily limited thereto.

In the drawings, the thickness of layers, films, panels, regions, etc., are exaggerated for clarity. The thickness of some layers and regions is exaggerated for better understanding and ease of description in the drawings. It will be understood that when an element such as a layer, film, region, or substrate is referred to as being "on" another element, it can be directly on the other element or intervening elements may also be present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1:
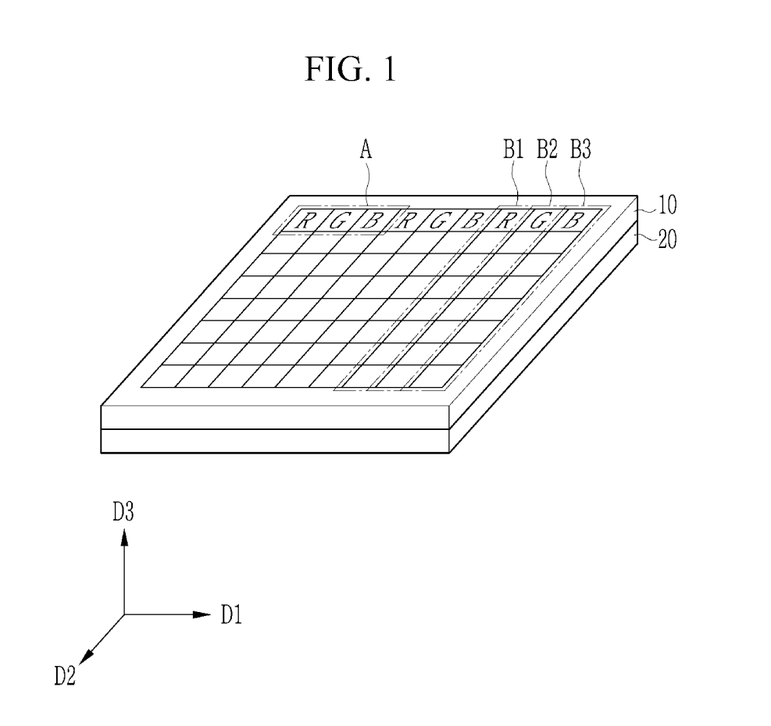
FIG. 1 is a schematic perspective view of an embodiment of a display device.
Figure 2:
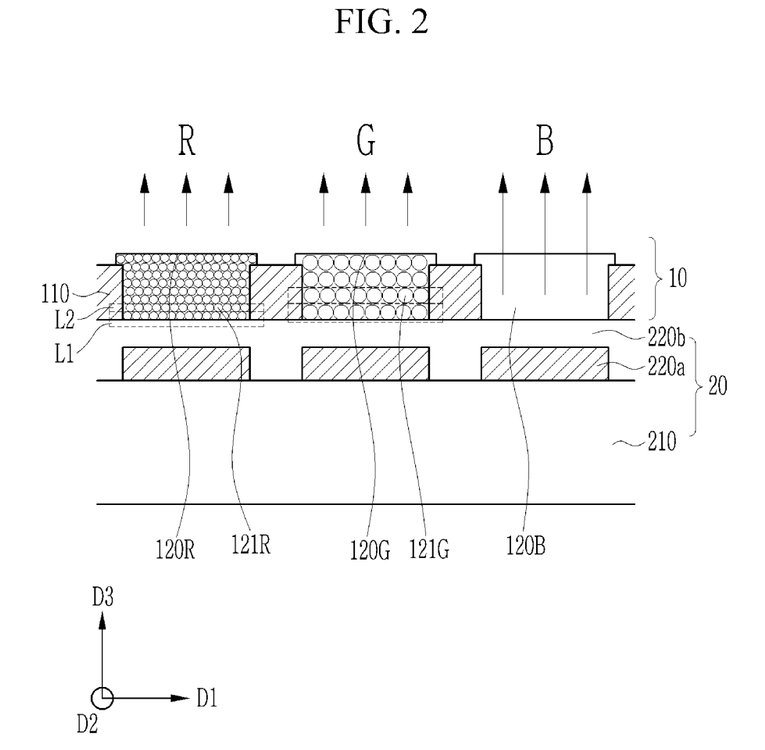
FIGS. 2 and 3 are schematic cross-sectional views of embodiments of display devices, respectively.
Figure 3:
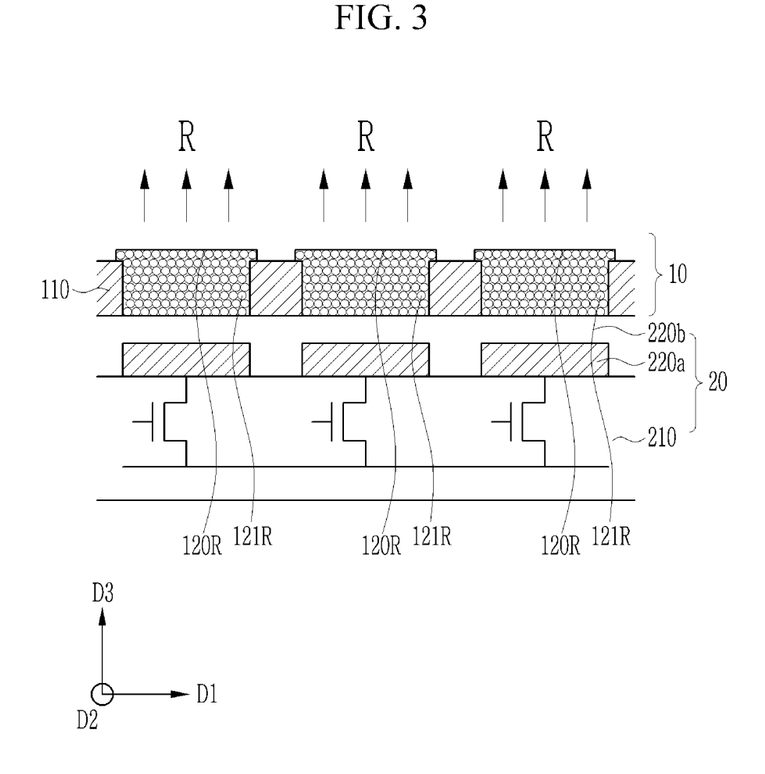

Hereinafter, referring to FIGS. 1 to 3, an embodiment of a display device is described. FIG. 1 is a schematic perspective view of an embodiment of a display device and FIGS. 2 and 3 are schematic perspective views of embodiments of display devices.

Referring to FIG. 1, an embodiment of a display device may include a display panel 20 and a color conversion panel 10 disposed on the display panel 20.

According to the display device in an embodiment, the display panel 20 and the color conversion panel 10 are combined to selectively emit red (R), green (G), and blue (B) light. In an embodiment, a plurality of pixels disposed along the direction D2 may emit the same color. In an embodiment, a plurality of pixels disposed along B1 may emit red light, a plurality of pixels disposed along B2 may emit green light, and a plurality of pixels disposed along B3 may emit blue light, for example. In an embodiment, a plurality of pixels included in B1 may be electrically connected to each other, a plurality of pixels included in B2 may be electrically connected to each other, and a plurality of pixels included in B3 may be also electrically connected to each other. Hereinafter, a more detailed description will be given.

The display panel 20 in an embodiment may include a plurality of light-emitting element packages aligned in a matrix shape. Each of the light-emitting element packages may constitute one pixel. In the disclosure, the light-emitting element packages aligned by 8×9 is illustrated for better understanding and ease of description, but actually, more light-emitting element packages depending on a desired resolution (e.g., 1024×768, 1920×1080, etc.) than this may be arranged.

Even though it is not illustrated in the disclosure, the display panel 20 may include a driving part which supplies electricity to each of the light-emitting element packages and a controlling part which controls the light-emitting element packages.

Hereinafter, FIG. 2 showing a cross-section obtained by cutting a region corresponding to A of FIG. 1 along a direction D1 and FIG. 3 showing a cross-section obtained by cutting a region corresponding to B1 of FIG. 1 along a direction D2 are used for illustration.

Referring to FIGS. 2 and 3, the display panel 20 in an embodiment includes a substrate 210, light-emitting element packages 220a disposed on the substrate 210, and a protective layer 220b disposed on the light-emitting element packages 220a.

The substrate 210 may be a transparent substrate. In an embodiment, the substrate 210 may include at least one of sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$), for example. However, in another embodiment, the substrate 210 may be omitted.

On the substrate 210, light-emitting element packages 220a emitting blue light may be disposed. The light-emitting element packages 220a may emit light by an applied power or driving signal. In an embodiment, the light-emitting element packages 220a may include semiconductor light emitting chips such as a light emitting diode ("LED"), for example. The specific stacking structure of each of light-emitting element packages 220a will be described later referring to FIG. 5.

In an exemplary embodiment, the central wavelength of light emitted from the plurality of light-emitting element packages may be about 430 nanometers (nm) to about 470 nm, for example, about 440 nm to about 460 nm.

In an exemplary embodiment, the pitch between adjacent light-emitting element packages 220a may be less than or equal to about 100 micrometers, for example. That is, a distance between the centers of two light-emitting element packages 220a disposed adjacent to each other may be less than or equal to about 100 micrometers, for example.

A plurality of light-emitting element packages 220a in an embodiment may be electrically connected to each other. As aforementioned referring to FIG. 1, the plurality of light-emitting element packages 220a disposed in the region corresponding to B1, that is, the plurality of light-emitting element packages 220a overlapped with a first color conversion layer 120R may be electrically connected to each other. The plurality of light-emitting element packages 220a disposed in the region corresponding to B2, that is, the plurality of light-emitting element packages 220a overlapped with a second color conversion layer 120G may be electrically connected to each other. The plurality of light-emitting element packages 220a disposed in the region corresponding to B3, that is, the plurality of light-emitting element packages 220a overlapped with a transmitting layer 120B is electrically connected to each other.

As schematically shown in an embodiment of FIG. 3, the plurality of light-emitting element packages 220a disposed in the region corresponding to B1 may be electrically connected to a drain electrode. The light-emitting element packages 220a disposed in the regions corresponding to B2 and B3 are the same as above. FIG. 3 shows a cross-sectional view of a display device, but a transistor circuit display is shown for effective understanding.

According to these connections, the light-emitting element packages 220a disposed in regions emitting the same color light may be simultaneously operated. The disclosure describes a configuration of connecting the drain electrodes each other but is not limited thereto, and the plurality of light-emitting element packages 220a may be connected through any wire when simultaneously operated.

On the light-emitting element packages 220a, the protective layer 220b may be disposed. The protective layer 220b may be an inorganic material or an organic material. When the protective layer 220b includes the inorganic material, the inorganic material may include a silicon oxide, a silicon nitride, or the like, for example. The protective layer 220b may cover the plurality of light-emitting element packages 220a and planarize the upper surface thereof.

The color conversion panel 10 in an embodiment may be disposed on the display panel 20. The color conversion panel 10 may not include a separate substrate and indicate a configuration element disposed on the display panel 20.

On the protective layer 220b, a light blocking member 110 may be disposed. The light blocking member 110 may have a lattice shape extended along the directions D1 and D2. Specifically, the light blocking member 110 may be disposed between the first color conversion layer 120R and the second color conversion layer 120G, between the second color conversion layer 120G and the transmitting layer 120B, and between the transmitting layer 120B and the first color conversion layer 120R. In addition, the light blocking member 110 may also be disposed between the first color conversion layer 120R and an adjacent first color conversion layer 120R, between the second color conversion layer 120G and an adjacent second color conversion layer 120G, and between the transmitting layer 120B and an adjacent transmitting layer 120B.

The light blocking member 110 may prevent mixing of different color lights emitted from adjacent pixels and may partition regions where the plurality of color conversion layers 120R and 120G and the transmitting layer 120B are disposed. The disclosure shows an example that the light blocking member 110 has a lower height than those of the first color conversion layer 120R, the second color conversion layer 120G, and the transmitting layer 120B, but is not limited thereto, and the light blocking member 110, the first color conversion layer 120R, the second color conversion layer 120G, and the transmitting layer 120B may have a substantially equivalent height.

The first color conversion layer 120R, the second color conversion layer 120G, and the transmitting layer 120B may be repetitively disposed along the direction D1.

The first color conversion layer 120R and the second color conversion layer 120G convert incident light from the display panel 20 and emit a converted light. The transmitting layer 120B emits light as it is without converting the incident light. As for the transmitting layer 120B, blue light, for example, may enter and may be emitted as it is.

The first color conversion layer 120R may include a plurality of first semiconductor nanocrystals 121R. The first semiconductor nanocrystals 121R may convert the incident blue light into red light. The second color conversion layer 120G may include a plurality of second semiconductor nanocrystals 121G. The second semiconductor nanocrystals 121G may convert the incident blue light into green light.

As shown in FIG. 2, the first color conversion layer 120R may have a form of stacking the plurality of first semiconductor nanocrystals 121R. A part of the plurality of first semiconductor nanocrystals 121R may form a first layer L1, another part of the plurality of first semiconductor nanocrystals 121R may form a second layer L2, and these layers may be repetitively stacked.

The first color conversion layer 120R may be provided by stacking at least one layer including the plurality of first semiconductor nanocrystals 121R. The first semiconductor nanocrystals 121R included in the first layer L1 may contact the first semiconductor nanocrystals 121R included in the second layer L2. The first color conversion layer 120R in an embodiment may include the plurality of first semiconductor nanocrystals 121R alone.

The second color conversion layer 120G may have a form of stacking the plurality of second semiconductor nanocrystals 121G. A part of the plurality of second semiconductor nanocrystals 121G may form the first layer L1, another part of the plurality of second semiconductor nanocrystals 121G may form the second layer L2, and these layers are repetitively stacked.

The second color conversion layer 120G may be provided by stacking at least one layer including the plurality of second semiconductor nanocrystals 121G. The second semiconductor nanocrystals 121G included in the first layer L1 may contact the second semiconductor nanocrystals 121G included in the second layer L2. The second color conversion layer 120G in an embodiment may include the plurality of second semiconductor nanocrystals 121G alone.

Each of the first semiconductor nanocrystals 121R and the second semiconductor nanocrystals 121G may include quantum dots. The quantum dots may include one of a Group II-VI compound, a Group III-V compound, a Group IV-VI compound, a Group IV element, a Group IV compound, and a combination thereof.

In an exemplary embodiment, the Group II-VI compound may include a binary element compound including one of CdSe, CdTe, ZnS, ZnSe, ZnTe, ZnO, HgS, HgSe, HgTe, MgSe, MgS, and a combination thereof, a ternary element compound including one of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound including one of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. In an exemplary embodiment, the Group III-V compound may include a binary element compound including one of GaN, GaP, GaAs, GaSb, AlN, AlP, AlAs, AlSb, InN, InP, InAs, InSb, and a combination thereof; a ternary element compound including one of GaNP, GaNAs, GaNSb, GaPAs, GaPSb, AlNP, AlNAs, AlNSb, AlPAs, AlPSb, InNP, InNAs, InNSb, InPAs, InPSb, and a combination thereof, and a quaternary element compound including one of GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a combination thereof. The Group IV-VI compound may include a binary element compound including one of SnS, SnSe, SnTe, PbS, PbSe, PbTe, and a combination thereof, a ternary element compound including one of SnSeS, SnSeTe, SnSTe, PbSeS, PbSeTe, PbSTe, SnPbS, SnPbSe, SnPbTe, and a combination thereof; and a quaternary element compound including one of SnPbSSe, SnPbSeTe, SnPbSTe, and a combination thereof. The Group IV element may include one of Si, Ge, and a combination thereof. The Group IV compound may be a binary element compound including one of SiC, SiGe, and a combination thereof.

The binary element compound, the ternary element compound, or the quaternary element compound may exist in a uniform concentration in the particle or in partially different concentrations in the same particle.

One quantum dot may surround other quantum dot to provide a core/shell structure. The core and the shell may have a concentration gradient where the concentration of the element(s) of the shell decreases toward the core.

In an exemplary embodiment, the quantum dots may have a full width of half maximum ("FWHM") of a photoluminescence wavelength of less than or equal to about 45 nm, for example, less than or equal to about 40 nm, or less than or equal to about 30 nm. Color purity and color reproducibility thereof may be improved within the ranges. Also, the light emitted through these quantum dots is emitted in all directions, and the viewing angle may be improved.

The quantum dots may be commercially available or may be synthesized in any method. In an embodiment, quantum dots may be a colloidal particle synthesized according to a wet chemical process, for example. In the wet chemical process, precursors react in an organic solvent to grow crystal particles, and the organic solvent or a ligand compound may coordinate the surface of the quantum dots, controlling the growth of the crystal. Examples of the organic solvent and the ligand compound are known. In the chemical wet process, the synthesized colloidal quantum dot may be collected by adding a non-solvent to a reaction solution and centrifuging a final mixture. Such a collecting process may cause removal of at least one part of the organic materials coordinated on the surface of the quantum dots. Examples of the non-solvent may be acetone, ethanol, methanol, and the like, but are not limited thereto.

The quantum dots may have an organic ligand bound to its surface. In an embodiment, the organic ligand may have a hydrophobic moiety. In an exemplary embodiment, the organic ligand may be RCOOH, $RNH_2$, $R_2NH$, $R_3N$, RSH, $R_3PO$, $R_3P$, ROH, RCOOR', $RPO(OH)_2$, $R_2POOH$ (where, R and R' are independently hydrogen, a C5 to C24 substituted or unsubstituted aliphatic hydrocarbon group, for example, a C5 to C24 alkyl group, a C5 to C24 alkenyl group, or a C5 to C20 aromatic hydrocarbon group, for example, a C6 to C20 aryl group, provided that at least one thereof is not hydrogen), or a combination thereof.

Examples of the organic ligand may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octylphosphine, dioctyl phosphine, tributylphosphine, or trioctylphosphine; phosphine compounds or oxide compounds thereof such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide; diphenyl phosphine, triphenyl phosphine, or oxide compounds thereof; C5 to C20 (mono- or di) alkylphosphinic acid such as (mono- or di) hexylphosphinic acid, (mono- or di) octylphosphinic acid, (mono- or di) dodecanephosphinic acid, (mono- or di) tetradecanephosphinic acid, (mono- or di) hexadecanephosphinic acid, or (mono- or di) octadecanephosphinic acid, C5 to C20 alkyl phosphonic acid such as hexylphosphonic acid, octylphosphonic acid, dodecanephosphonic acid, tetradecanephosphonic acid, hexadecanephosphonic acid, octadecanephosphonic acid; and the like, but are not limited thereto. The quantum dots may include the organic ligand alone or as a combination of two or more.

In an embodiment, the first semiconductor nanocrystal 121R and the second semiconductor nanocrystal 121G may exhibit positive or negative polarity. In an embodiment, the first semiconductor nanocrystal 121R and the second semiconductor nanocrystal 121G may exhibit (+) polarity, for example.

The polarity of the first semiconductor nanocrystal 121R and the second semiconductor nanocrystal 121G may be determined by the organic ligand bound to the first semiconductor nanocrystal 121R and the second semiconductor nanocrystal 121G. Depending on the bound organic ligands, the first semiconductor nanocrystal 121R and the second semiconductor nanocrystal 121G may exhibit (+) polarity or (−) polarity.

When the first semiconductor nanocrystals 121R include a red phosphor, the red phosphor may include at least one of (Ca, Sr, Ba)S, $(Ca, Sr, Ba)_2Si_5N_8$, $CaAlSiN_3$, $CaMoO_4$, and $Eu_2Si_5N_8$, for example.

In an exemplary embodiment, when the second semiconductor nanocrystals 121G include a green phosphor, the green phosphor may include at least one of yttrium aluminum garnet (YAG), $(Ca, Sr, Ba)_2SiO_4$, $SrGa_2S_4$, barium magnesium aluminate (BAM), alpha SiAlON (α-SiAlON), beta SiAlON (β-SiAlON), $Ca_3Sc_2Si_3O_{12}$, $Tb_3Al_5O_{12}$, $BaSiO_4$, CaAlSiON, and $(Sr_{1-x}Ba_x)Si_2O_2N_2$. The x may be any random number between 0 to 1.

The transmitting layer 120B may transmit an incident light as it is. The transmitting layer 120B may include a transparent resin transmitting blue light. The transmitting layer 120B disposed in a region where the blue light emits includes no particular semiconductor nanocrystals and transmits the incident blue light as it is.

Although not shown in the drawings, the transmitting layer 120B may further include at least either a dye and a pigment. The transmitting layer 120B including the dye or the pigment may reduce reflection of an external light and provide blue light having improved color purity.

Figure 4:
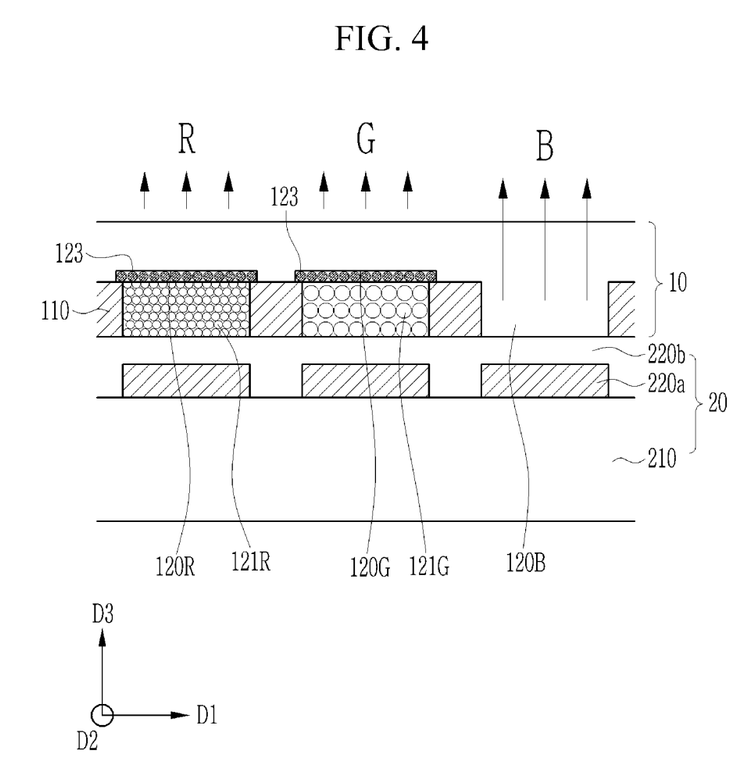
FIG. 4 is a schematic cross-sectional view of an embodiment of a display device.

Hereinafter, referring to FIG. 4, an embodiment of a display device is described. FIG. 4 is a schematic cross-sectional view of an embodiment of a display device. Descriptions of the same configuration elements as those of the above-described configuration elements will be omitted.

At least one of the first color conversion layer 120R and the second color conversion layer 120G may further include a scattering layer 123 composed of scattering bodies. The scattering layer 123 may increase dose of light that is converted or passed through the color conversion layers 120R and 120G, and may uniformly provide front luminance and lateral luminance.

The scattering layer 123 may include any material for uniformly scattering incident light. In an exemplary embodiment, the scattering bodies included in the scattering layer 123 may include at least one of $TiO_2$, $ZrO_2$, $Al_2O_3$, $In_2O_3$, ZnO, $SnO_2$, $Sb_2O_3$, and ITO, for example.

The disclosure does not illustrate embodiments where the transmitting layer 120B includes a scatterer, but the transmitting layer 120B may include the scatterer.

The transmitting layer 120B in an embodiment may be overlapped with the front surface of a substrate 210. Specifically, the transmitting layer 120B may include a transparent resin. The transmitting layer 120B including a transparent material may cover both the first color conversion layer 120R and the second color conversion layer 120G. The transmitting layer 120B overlapped with the light-emitting element packages 220a but not with the color conversion layers 120R and 120G may emit blue light. The transmitting layer 120B overlapping the other color conversion layers 120R and 120G may planarize the upper surface of the color conversion layers 120R and 120G. When this transmitting layer 120B is included, a separate planarization process may be omitted, and thus the manufacturing process may be simplified, and a separate configuration element may be easily stacked on the transmitting layer 120B and the color conversion layers 120R and 120G.

Figure 5:
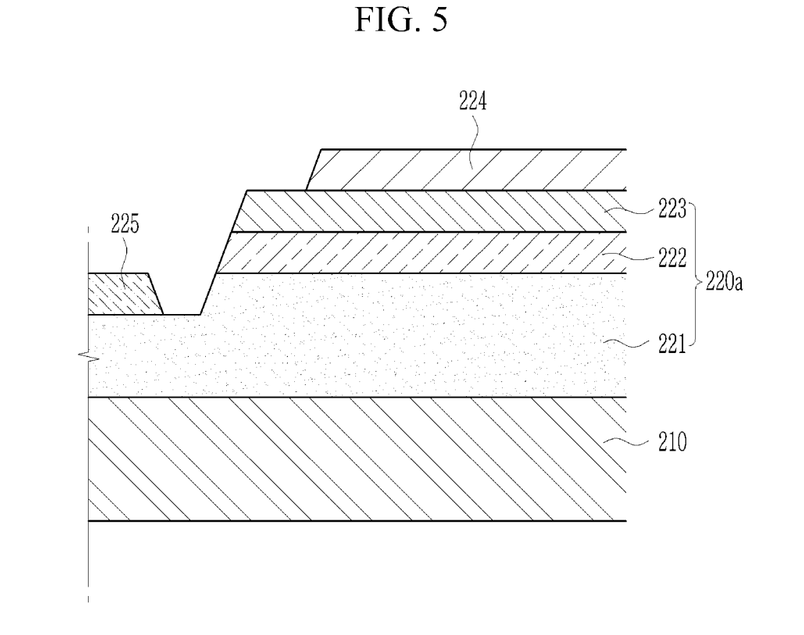
FIG. 5 is a schematic cross-sectional view of an embodiment of a part of configuration elements of a display panel.

Hereinafter, referring to FIG. 5, an embodiment of a light-emitting element package including a display panel is described. FIG. 5 is a schematic cross-sectional view of an embodiment of a partial region of a light-emitting element package.

A display panel 20 in an embodiment includes a first conductivity-type semiconductor layer 221 disposed on a substrate 210, an active layer 222 disposed on the first conductivity-type semiconductor layer 221, and a second conductivity-type semiconductor layer 223 disposed on the active layer 222. The light-emitting element packages 220a may include the first conductivity-type semiconductor layer 221, the active layer 222, and the second conductivity-type semiconductor layer 223.

The first conductivity-type semiconductor layer 221 may be an n-type semiconductor layer and the second conductivity-type semiconductor layer 223 may be a p-type semiconductor layer. In addition, the first conductivity-type semiconductor layer 221 and the second conductivity-type semiconductor layer 223 may include a nitride semiconductor. In an exemplary embodiment, the first conductivity-type semiconductor layer 221 and the second conductivity-type semiconductor layer 223 may have a composition formula of $Al_xIn_yGa_{(1-x-y)}N$ (where, $0 \leq x \leq 1$, $0 \leq y \leq 1$, and $0 \leq x+y \leq 1$). The first conductivity-type semiconductor layer 221 and the second conductivity-type semiconductor layer 223 may include at least one material including at least one of GaN, AlGaN, and InGaN. In an embodiment, the first conductivity-type semiconductor layer 221 may include a nitride semiconductor material doped with an n-type and the second conductivity-type semiconductor layer 223 may include a nitride semiconductor material doped with a p-type. In an embodiment, the first conductivity-type semiconductor layer 221 may include GaN doped with an n-type and the second conductivity-type semiconductor layer 223 may include GaN doped with a p-type, for example.

The active layer 222 may emit light having predetermined energy due to recombination of electrons and holes and have a multi quantum wells ("MQW") structure of alternately stacking the quantum well layer and the quantum barrier layer. The MQW structure may have an InGaN/GaN structure. The first conductivity-type semiconductor layer 221, the active layer 222, and the second conductivity-type semiconductor layer 223 may be epitaxial layers.

In some embodiments, the light-emitting element packages 220a may be provided by a metal-organic chemical vapor deposition ("MOCVD"), hydride vapor phase epitaxy ("HVPE"), or molecular beam epitaxy ("MBE") process, for example.

Although not shown in the drawings, a nitride semiconductor thin film may be disposed between the substrate 210 and the light-emitting element packages 220a. The nitride semiconductor thin film may serve as a buffer layer to mitigate lattice mismatch between the substrate 210 and the first conductivity-type semiconductor layer 221.

The first conductivity-type semiconductor layer 221 may be connected to a first electrode 225, and the second conductivity-type semiconductor layer 223 may be connected to a second electrode 224. The first electrode 225 and the second electrode 224 are separated but do not contact each other.

The first electrode 225 and the second electrode 224 may include a metal or an alloy having high reflectance in a wavelength region of light emitted from the light-emitting element packages 220a. The first electrode 225 and the second electrode 224 may respectively include a single layer including a single material including one of Au, Sn, Ni, Pb, Ag, In, Cr, Ge, Si, Ti, W, and Pt or an alloy including at least two materials selected therefrom or a multilayer including a combination thereof.

At least one of the first electrode 225 and the second electrode 224 may be an electrode including nanopores. When the protective layer 220b is omitted in another embodiment, at least one of the first electrode 225 and the second electrode 224 includes nanopores and thus may increase a contact area with the semiconductor nanocrystals 121R and 121G. The semiconductor nanocrystals 121R and 121G may be stably disposed on the first electrode 225 and the second electrode 224.

Hereinafter, referring to FIGS. 6 to 9, an embodiment of a method of manufacturing a display device is described. FIGS. 6, 7, 8, and 9 are cross-sectional views showing an embodiment of a method of manufacturing a display device. Description of the same configuration elements as those of the above-described configuration elements may be omitted.

Figure 6:
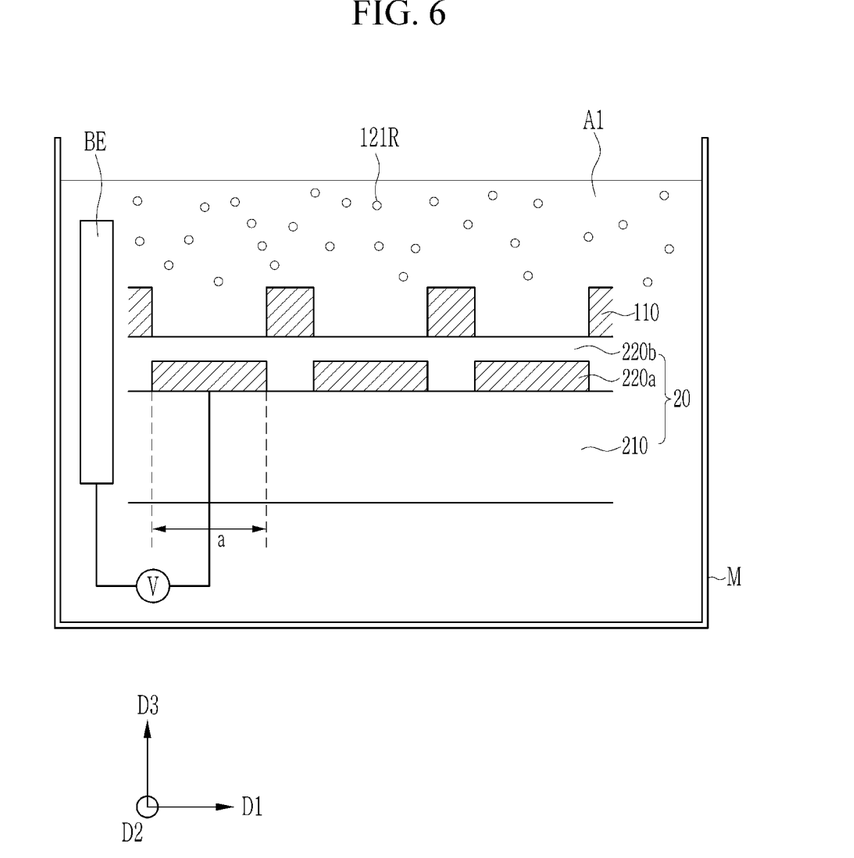
FIGS. 6, 7, 8, and 9 are cross-sectional views showing an embodiment of a method of manufacturing a display device.

First, referring to FIG. 6, the light-emitting element packages 220a and the protective layer 220b are provided. The light blocking member 110 is disposed on the protective layer 220b.

The light blocking member 110 and the display panel 20 are then introduced into a chamber M including the first solution A1. The light-emitting element packages 220a disposed in the region a may be connected to the electrode BE.

In the chamber M, the first solution A1 may be contained. The first solution A1 may include a solvent and the first semiconductor nanocrystals 121R dispersed in the solvent. The surface of the first semiconductor nanocrystals 121R may have predetermined polarity, for example, the surface of the first semiconductor nanocrystals 121R may have positive polarity.

A ligand may be bound on the surface of the first semiconductor nanocrystals 121R in an embodiment, and accordingly, the first semiconductor nanocrystals 121R may show different polarity depending on a type of the ligand. The solvent may for example, use an inorganic solvent such as water but is not limited thereto.

When a voltage is applied to the light-emitting element packages 220a and the electrode BE, the first semiconductor nanocrystals 121R showing predetermined polarity move to a position where overlapped with the light-emitting element packages 220a in the region a. In an embodiment, the first semiconductor nanocrystals 121R showing a positive charge may move to a position where overlapped with the light-emitting element packages 220a in the region a by applying a (−) voltage to the light-emitting element packages 220a and a (+) voltage to the electrode BE, for example. In this disclosure, this method is referred to as an electrophoresis.

However, the disclosure is not limited thereto, but the first semiconductor nanocrystals 121R showing a negative charge may move to a position where overlapped with the light-emitting element packages 220a in the region a by applying a (+) voltage to the light-emitting element packages 220a and a (−) voltage to the electrode BE.

Figure 7:
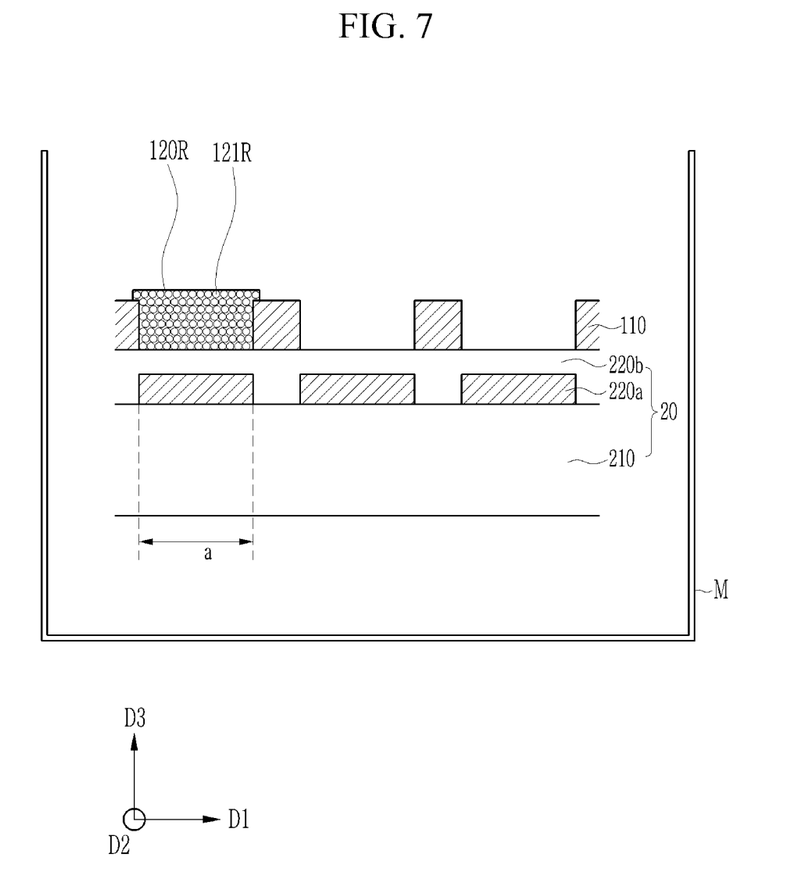

When the plurality of first semiconductor nanocrystals 121R moves to the region a, and then, the first solution A1 is removed, as shown in FIG. 7, the first color conversion layer 120R including the first semiconductor nanocrystals 121R may be provided. The first color conversion layer 120R may be provided as the first color conversion layer 120R including the first semiconductor nanocrystals 121R alone without a substantive medium (e.g., a binder, a monomer, etc.).

Figure 8:
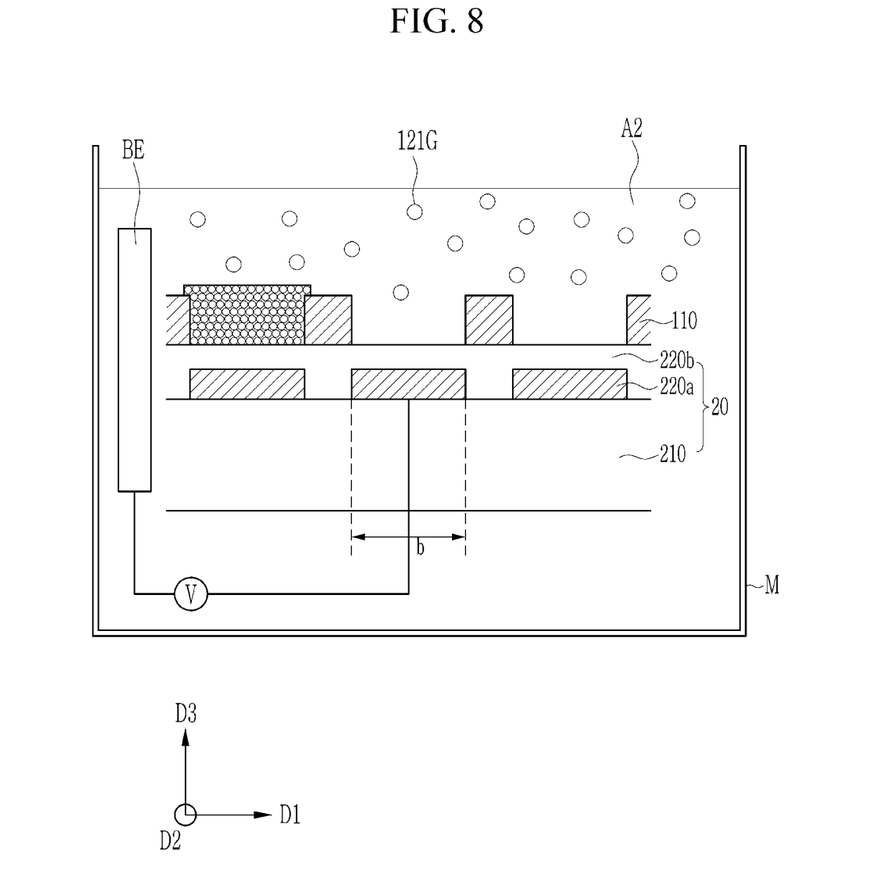

Substantially, referring to FIG. 8, a second solution A2 may be contained in the chamber M. The second solution A2 may include a solvent and the second semiconductor nanocrystals 121G dispersed in the solvent. The surface of the second semiconductor nanocrystals 121G may show predetermined polarity, for example, positive polarity.

A ligand may be bonded on the surface of the second semiconductor nanocrystals 121G in an embodiment, and the second semiconductor nanocrystals 121G may show different polarity depending on a type of the ligand. The solvent may be for example, an inorganic solvent such as water but is not limited thereto.

When a voltage is applied to the light-emitting element packages 220a and the electrode BE, the second semiconductor nanocrystals 121G showing predetermined polarity may move to a position where overlapped with the light-emitting element packages 220a in a region b. In an embodiment, the second semiconductor nanocrystals 121G showing positive charges may move to a position where overlapped with the region b by applying a (−) voltage to the light-emitting element packages 220a and a (+) voltage to the electrode BE, for example.

However, the disclosure is not limited thereto, but the second semiconductor nanocrystals 121G showing positive charges may move to a position where overlapped with the region b by applying a (+) voltage to the light-emitting element packages 220a and a (−) voltage to the electrode BE.

Figure 9:
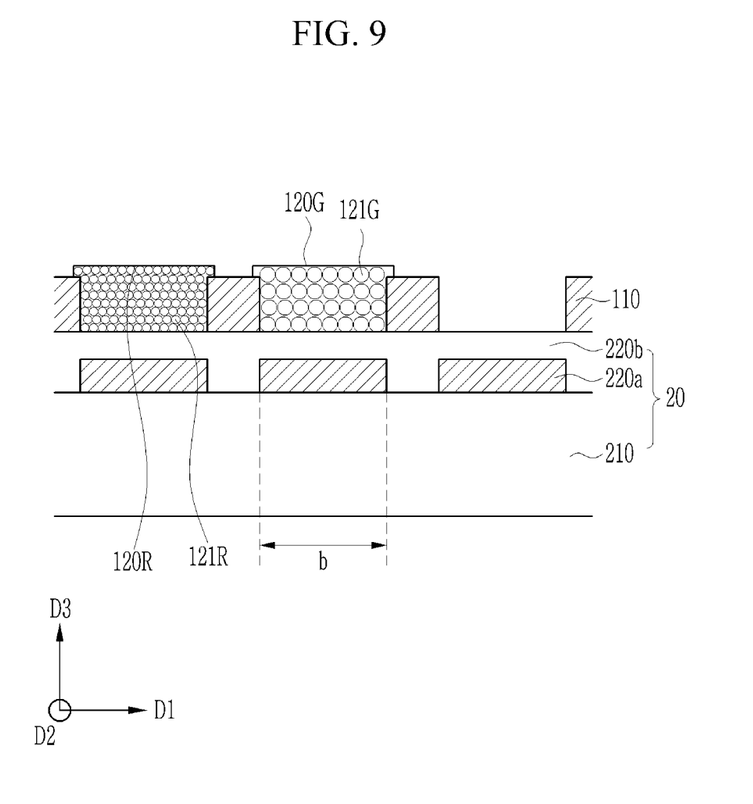

When the plurality of second semiconductor nanocrystals 121G moves to the region b, and then, the second solution A2 is removed, as shown in FIG. 9, the second color conversion layer 120G including the second semiconductor nanocrystals 121G may be provided. The second color conversion layer 120G may be provided as the second color conversion layer 120G including the second semiconductor nanocrystals 121G alone without a substantive medium (e.g., a binder, a monomer, etc.).

Subsequently, a transparent resin may be coated in the rest of region and patterned to provide a color conversion panel 10 shown in FIG. 2. In an alternative embodiment, a transparent resin layer overlapped with the whole substrate 210 is provided and thus may provide the color conversion panel 10 shown in FIG. 4. In addition, although not shown in the drawings, a scattering layer may be disposed on the color conversion layer by equally using the aforementioned electrophoresis.

Hereinbefore, the embodiments of the invention have been described and illustrated, however, it is apparent to a person with ordinary skill in the art that the invention is not limited to the embodiment as described, and may be variously modified and transformed without departing from the spirit and scope of the invention. Accordingly, the modified or transformed embodiments as such may not be understood separately from the technical ideas and embodiments of the invention, and the modified embodiments are within the scope of the claims of the invention.

What is claimed is:

1. A display device comprising:
a plurality of light-emitting element packages, and
a first color conversion layer, a second color conversion layer, and a transmitting layer disposed on the plurality of light-emitting element packages,
wherein each of the first color conversion layer, the second color conversion layer, and the transmitting layer is overlapped with one of the plurality of light-emitting element packages,
the first color conversion layer comprises a plurality of first semiconductor nanocrystals, and
the plurality of first semiconductor nanocrystals forms at least two layers, and
wherein each of the plurality of light-emitting element packages comprises:
a first conductivity-type semiconductor layer,
a second conductivity-type semiconductor layer overlapped with the first conductivity-type semiconductor layer,
an active layer disposed between the first conductivity-type semiconductor layer and the second conductivity-type semiconductor layer,
a first electrode connected to the first conductivity-type semiconductor layer, and
a second electrode connected to the second conductivity-type semiconductor layer,
wherein
at least one of the first electrode and the second electrode comprises nanopores.

2. The display device of claim 1, wherein
a part of the plurality of first semiconductor nanocrystals provides a first layer,
a remaining part of the plurality of first semiconductor nanocrystals provides a second layer, and
the first layer and the second layer contact each other.

3. The display device of claim 2, wherein first semiconductor nanocrystals of the plurality of first semiconductor nanocrystals included in the first layer and first semiconductor nanocrystals plurality of first semiconductor nanocrystals included in the second layer contact each other.

4. The display device of claim 1, wherein
the second color conversion layer comprises a plurality of second semiconductor nanocrystals, and
the plurality of second semiconductor nanocrystals form at least two layers.

5. The display device of claim 4, wherein
a part of the plurality of second semiconductor nanocrystals provides a first layer,
a remaining part of the plurality of second semiconductor nanocrystals provides a second layer, and
the first layer and the second layer contact each other.

6. The display device of claim 5, wherein a second semiconductor nanocrystal of the plurality of second semiconductor nanocrystals included in the first layer and a second semiconductor nanocrystal of the plurality of second semiconductor nanocrystals included in the second layer contact each other.

7. The display device of claim 1, wherein the plurality of light-emitting element packages overlapped with the first color conversion layer is electrically connected to each other.

8. The display device of claim 1, wherein the plurality of light-emitting element packages overlapped with the second color conversion layer is electrically connected to each other.

9. The display device of claim 1, wherein the plurality of light-emitting element packages overlapped with the transmitting layer is electrically connected to each other.

* * * * *